United States Patent
Kobayashi et al.

(10) Patent No.: US 12,080,517 B2
(45) Date of Patent: Sep. 3, 2024

(54) IGNITION METHOD AND PLASMA PROCESSING APPARATUS

(71) Applicant: Tokyo Electron Limited, Tokyo (JP)

(72) Inventors: Takeshi Kobayashi, Iwate (JP); Takeshi Ando, Yamanashi (JP); Kazumasa Igarashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 189 days.

(21) Appl. No.: 17/686,716

(22) Filed: Mar. 4, 2022

(65) Prior Publication Data

US 2022/0293394 A1    Sep. 15, 2022

(30) Foreign Application Priority Data

Mar. 11, 2021  (JP) .................................. 2021-039651

(51) Int. Cl.
    *H01J 37/32*    (2006.01)
(52) U.S. Cl.
    CPC ... *H01J 37/32183* (2013.01); *H01J 2237/327* (2013.01)
(58) Field of Classification Search
    None
    See application file for complete search history.

(56) References Cited

U.S. PATENT DOCUMENTS

| | | | | |
|---|---|---|---|---|
| 3,988,566 A * | 10/1976 | Vogts | ....................... | C23C 4/134 |
| | | | | 315/111.21 |
| 5,226,967 A * | 7/1993 | Chen | ..................... | C23C 16/507 |
| | | | | 315/111.21 |
| 6,291,938 B1 * | 9/2001 | Jewett | ............... | H01J 37/32174 |
| | | | | 315/111.41 |
| 6,528,948 B1 * | 3/2003 | Hershcovitch | ........... | H05H 7/14 |
| | | | | 219/121.48 |
| 11,881,381 B2 * | 1/2024 | Kapoor | .............. | G01R 27/2605 |
| 2004/0070346 A1 * | 4/2004 | Choi | ................. | H01J 37/32357 |
| | | | | 315/111.21 |
| 2004/0222184 A1 * | 11/2004 | Hayami | ............ | H01J 37/32183 |
| | | | | 216/16 |
| 2008/0011424 A1 * | 1/2008 | Yin | .................... | H01J 37/32899 |
| | | | | 156/345.48 |
| 2011/0193483 A1 * | 8/2011 | Mattaboni | .............. | G01N 21/73 |
| | | | | 315/111.21 |

(Continued)

FOREIGN PATENT DOCUMENTS

| | | |
|---|---|---|
| JP | H10-064696 A | 3/1998 |
| JP | 2015-122150 A | 7/2015 |

(Continued)

*Primary Examiner* — Srinivas Sathiraju
(74) *Attorney, Agent, or Firm* — Venjuris, P.C.

(57) ABSTRACT

An ignition method in a plasma processing apparatus includes: applying a first radio frequency from a radio-frequency power supply to an electrode of a plasma generator, thereby igniting plasma from a gas, the radio-frequency power supply being capable of applying a radio frequency of a variably controlled frequency to the electrode of the plasma generator; and applying a second radio frequency different from the first radio frequency to the electrode of the plasma generator after a predetermined time is elapsed after applying the first radio frequency to the electrode of the plasma generator.

8 Claims, 8 Drawing Sheets

(56) References Cited

U.S. PATENT DOCUMENTS

| | | | |
|---|---|---|---|
| 2011/0236599 A1* | 9/2011 | Furuta | H01J 37/32091 118/723 E |
| 2013/0008605 A1* | 1/2013 | Yin | H01L 21/67161 156/345.29 |
| 2013/0065396 A1* | 3/2013 | Dhindsa | H01L 21/306 438/694 |
| 2013/0084693 A1* | 4/2013 | Kakimoto | C23C 16/45523 438/482 |
| 2013/0260567 A1* | 10/2013 | Marakhtanov | H01J 37/32091 156/345.44 |
| 2013/0277333 A1* | 10/2013 | Misra | H01J 37/32183 216/61 |
| 2013/0327272 A1* | 12/2013 | Augustyniak | H01J 37/32917 118/712 |
| 2014/0062304 A1* | 3/2014 | Nakano | H01J 37/32091 315/111.21 |
| 2014/0367043 A1* | 12/2014 | Bishara | H01J 37/32165 315/111.21 |
| 2014/0367046 A1* | 12/2014 | Todorow | H01J 37/32532 315/111.21 |
| 2015/0097485 A1* | 4/2015 | Vane | H01J 37/32449 315/111.21 |
| 2016/0234924 A1* | 8/2016 | Smith | H01J 37/32247 |
| 2017/0243723 A1* | 8/2017 | Van Zyl | H02J 9/00 |
| 2019/0385821 A1* | 12/2019 | Long | H03K 5/135 |
| 2020/0299839 A1* | 9/2020 | Yabe | C23C 16/45553 |
| 2020/0411287 A1* | 12/2020 | Gu | H01J 37/32174 |
| 2021/0407771 A1* | 12/2021 | Funk | H01J 37/3299 |
| 2022/0013333 A1* | 1/2022 | Tabuki | H01J 37/32449 |
| 2022/0020572 A1* | 1/2022 | Matsuura | H01J 37/32568 |
| 2022/0122812 A1* | 4/2022 | Kobayashi | H01J 37/32183 |
| 2022/0293394 A1* | 9/2022 | Kobayashi | H01J 37/32183 |
| 2023/0170185 A1* | 6/2023 | Uhm | H01J 37/32045 156/345.48 |
| 2023/0274914 A1* | 8/2023 | Marakhtanov | H01J 37/32091 361/234 |

FOREIGN PATENT DOCUMENTS

| | | |
|---|---|---|
| WO | 2006/095772 A1 | 4/2005 |
| WO | 2016/002590 A1 | 1/2016 |

\* cited by examiner

FIG. 5

| PROCESS CONDITION | PRESET | | UPDATE Pr [W] | THRESHOLD VALUE | | OPERATION START CONDITION | | SET POWER |
|---|---|---|---|---|---|---|---|---|
| | VC1p [%] | VC2p [%] | | ΔVC1 [%] | ΔVC2 [%] | FREQUENCY [MHz] | TIME [msec] | Pf [W] |
| A | C1a | C2a | Pra | ΔS1a | ΔS2a | fa | ta | Pfa |
| B | C1b | C2b | Prb | ΔS1b | ΔS2b | fb | tb | Pfb |
| C | C1c | C2c | Prc | ΔS1c | ΔS2c | fc | tc | Pfc |
| D | C1d | C2d | Prd | ΔS1d | ΔS2d | fd | td | Pfd |
| E | C1e | C2e | Pre | ΔS1e | ΔS2e | fe | te | Pfe |

110

IGNITION METHOD AND PLASMA PROCESSING APPARATUS

CROSS-REFERENCE TO RELATED APPLICATION

This application is based on and claims priority from Japanese Patent Application No. 2021-039651 filed on Mar. 11, 2021 with the Japan Patent Office, the disclosure of which is incorporated herein in its entirety by reference.

TECHNICAL FIELD

The present disclosure relates to an ignition method and a plasma processing apparatus.

BACKGROUND

Japanese Patent Laid-Open Publication No. 2015-122150 discloses, for example, a plasma processing method capable of generating and reliably maintaining plasma between an upper electrode and a susceptor disposed opposite to each other. In Japanese Patent Laid-Open Publication No. 2015-122150, an auxiliary circuit is provided to reduce a difference between the minimum reflection frequency $F_1$ of a first path $L_1$ through which a radio frequency current generated from a VF power supply flows before and after the ignition of plasma and the minimum reflection frequency $F_2$ of a second path $L_2$, and to ignite and maintain the plasma.

SUMMARY

According to an aspect of the present disclosure, an ignition method in a plasma processing apparatus includes: applying a first radio frequency from a radio-frequency power supply to the electrode of a plasma generator, thereby igniting plasma from a gas, the radio-frequency power supply being capable of applying a radio frequency of a variably controlled frequency to the electrode of the plasma generator; and applying a second frequency different from the first frequency to the electrode of the plasma generator after a predetermined time is elapsed after applying the first radio frequency to the electrode of the plasma generator.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a diagram illustrating an example of a condition table according to the embodiment.

DETAILED DESCRIPTION

Figure 1:
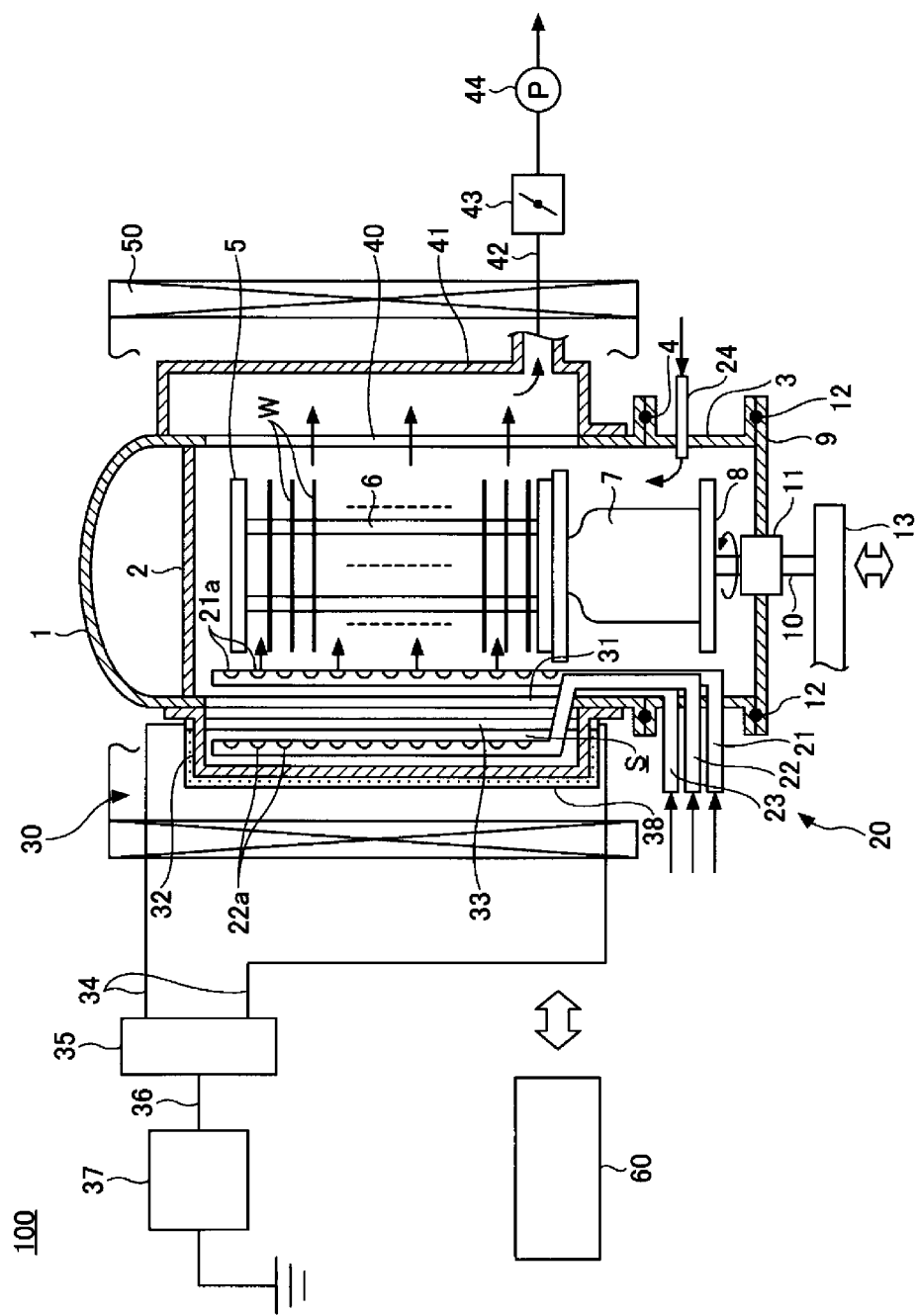
FIG. 1 is a vertical cross-sectional view of a plasma processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the accompanying drawings. In each of the drawings, the same elements may be designated by the same reference numerals and redundant descriptions thereof may be omitted.

[Plasma Processing Apparatus]

Figure 2:
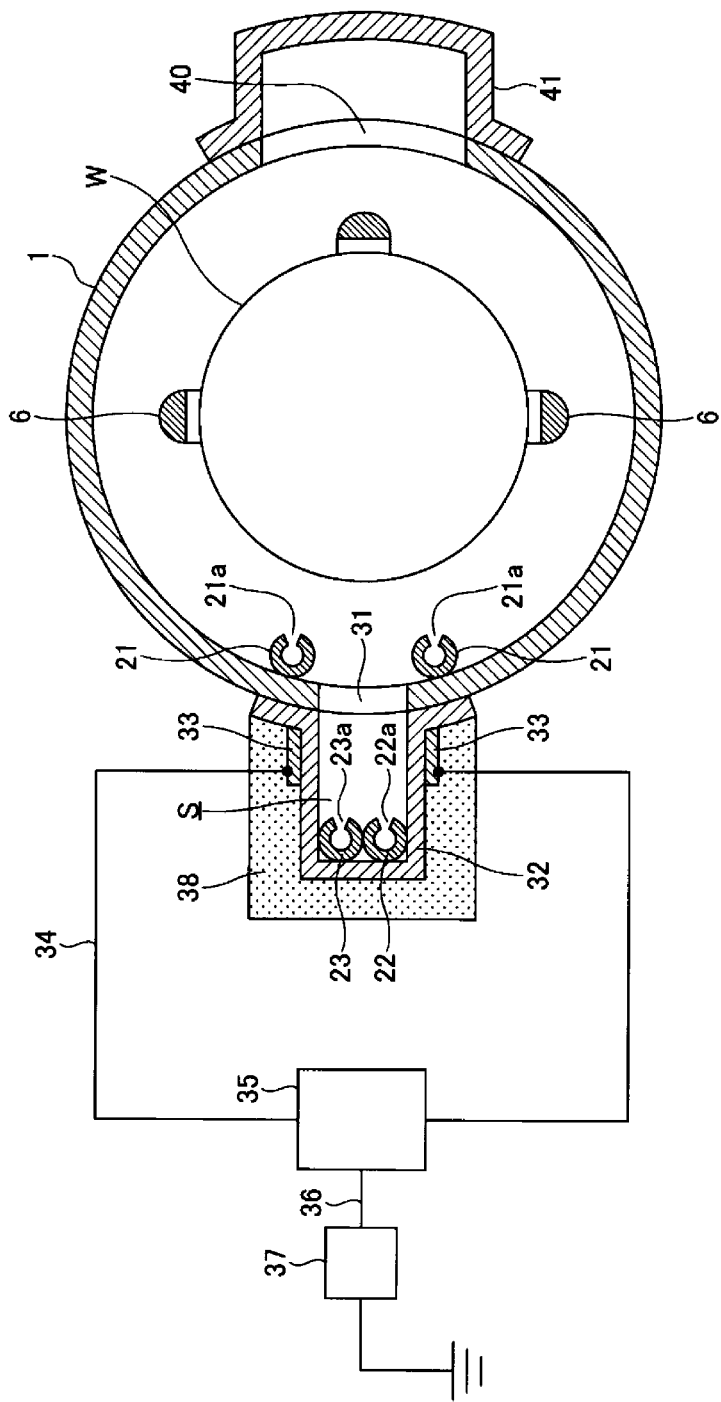
FIG. 2 is a cross-sectional view of the plasma processing apparatus according to the embodiment.

First, an example of the configuration of a plasma processing apparatus 100 in the present disclosure will be described with reference to FIGS. 1 and 2. FIG. 1 is a vertical cross-sectional view of a plasma processing apparatus 100 according to an embodiment. FIG. 2 is a cross-sectional view of the plasma processing apparatus 100 according to the embodiment.

The plasma processing apparatus 100 includes a cylindrical processing container 1 having a ceiling and an open lower end. The entire processing container 1 is formed of, for example, quartz. A ceiling plate 2 formed of quartz is provided near the upper end of the processing container 1, and a region below the ceiling plate 2 is sealed. A metal manifold 3 formed into a cylindrical shape is connected to the opening at the lower end of the processing container 1 via a sealing member 4 such as an O-ring.

The manifold 3 supports the lower end of the processing container 1, and a boat 5 on which a large number (e.g., 25 to 150) of substrates W is placed in multiple tiers is inserted into the processing container 1 from below the manifold 3. In this way, a large number of substrates W is accommodated in the processing container 1 substantially horizontally at intervals along the vertical direction. The boat 5 is formed of, for example, quartz. The boat 5 has three rods 6, and a large number of substrates W is supported by grooves (not illustrated) formed in the rods 6. The substrate W may be, for example, a semiconductor wafer.

The boat 5 is placed on a table 8 via a heat insulating cylinder 7 formed of quartz. The table 8 is supported on a rotating shaft 10. The rotating shaft 10 penetrates a metal (stainless steel) cover 9 that opens and closes the opening at the lower end of the manifold 3.

A magnetic fluid seal 11 is provided at the penetrating portion of the rotating shaft 10 to airtightly seal and rotatably support the rotating shaft 10. A sealing member 12 is provided between the periphery of the cover 9 and the lower end of the manifold 3 to maintain airtightness in the processing container 1.

The rotating shaft 10 is attached to the tip of an arm 13 supported by an elevating mechanism (not illustrated) such as, for example, a boat elevator. The boat 5 and the cover 9 move up and down integrally, and are inserted into and removed from the inside of the processing container 1. The table 8 may be fixed to the cover 9 so that the substrates W are processed without rotating the boat 5.

The plasma processing apparatus 100 includes a gas supply 20 that supplies a predetermined gas such as a processing gas or a purge gas into the processing container 1. The gas supply 20 includes gas supply pipes 21 to 23.

The gas supply pipes 21 to 23 are formed of, for example, quartz, penetrate the side wall of the manifold 3 inward, bend upward, and extend vertically. Gas holes 21a to 23a are formed in the vertical portions of the gas supply pipes 21 to 23, respectively, at predetermined intervals over a length in the vertical direction corresponding to the substrate support range of the boat 5 (see, e.g., FIG. 2). Each of the gas holes 21a, 23a, and 23a discharges a gas in the horizontal direction. A gas supply pipe 24 is formed of, for example, quartz and is composed of a short quartz pipe provided to penetrate the side wall of the manifold 3.

The vertical portion of the gas supply pipe 21 is provided in the processing container 1. A raw material gas is supplied from a gas supply to the gas supply pipe 21 source via the gas pipe. The gas pipe is provided with a flow rate controller and an on-off valve. As a result, the raw material gas is supplied from the gas supply source into the processing container 1 at a predetermined flow rate via the gas pipe and the gas supply pipe 21.

The vertical portion of the gas supply pipe 22 is provided in a plasma generation space S. Nitriding gas or oxidizing gas is supplied from a gas supply source to the gas supply pipe 22 via the gas pipe. The gas pipe is provided with a flow rate controller and an on-off valve. As a result, the nitriding gas or oxidizing gas is supplied from the gas supply source to the plasma generation space S at a predetermined flow rate via the gas pipe and the gas supply pipe 22, formed into a plasma in the plasma generation space S, supplied into the processing container 1.

When a $SiO_2$ film is formed using the atomic layer deposition (ALD) method, dipropylaminosilane (DPAS), which is an example of a raw material gas, may be supplied from the gas supply pipe 21, and oxygen ($O_2$) gas may be supplied from the gas supply pipe 22. When forming a SiN film using the ALD method, trisilylamine (TSA: $(SiH_3)_3N$), which is an example of a raw material gas, may be supplied from the gas supply pipe 21, and ammonia ($NH_3$) gas may be supplied from the gas supply pipe 22.

After supplying the $NH_3$ gas and before adsorbing the TSA, an exposure to hydrogen plasma and chlorine plasma may be performed to increase the cycle rate. In an example, the gas supply pipe 21 supplies the TSA into the processing container 1. The gas supply pipe 22 supplies ammonia ($NH_3$) gas. The gas supply pipe 22 also supplies hydrogen ($H_2$) gas.

The vertical portion of the gas supply pipe 23 is provided in the plasma generation space S. Chlorine ($Cl_2$) gas is supplied from a gas supply source to the gas supply pipe 23 via the gas pipe. The gas pipe is provided with a flow rate controller and an on-off valve. As a result, the chlorine gas is supplied from the gas supply source to the plasma generation space S at a predetermined flow rate via the gas pipe and the gas supply pipe 23, formed into a plasma in the plasma generation space S, supplied into the processing container 1.

Purge gas is supplied from a purge gas supply source to the gas supply pipe 24 via the gas pipe. The gas pipe is provided with a flow rate controller and an on-off valve. As a result, the purge gas is supplied from the purge gas supply source into the processing container 1 at a predetermined flow rate via the gas pipe and the gas supply pipe 24. The purge gas may be, for example, an inert gas such as nitrogen ($N_2$) or argon (Ar). The purge gas may be supplied from at least one of the gas supply pipes 21 to 23.

A plasma generator 30 is provided on a part of the side wall of the processing container 1. The plasma generator 30 forms $NH_3$ gas into a plasma to generate an active species for nitriding. The plasma generator 30 forms $H_2$ gas into a plasma to generate hydrogen (H) radicals. The plasma generator 30 forms $Cl_2$ gas into a plasma to generate chlorine (Cl) radicals.

The plasma generator 30 includes a plasma partition wall 32, a pair of plasma electrodes 33, a feeding line 34, a matching unit 35, a coaxial cable 36, a radio-frequency (RF) power supply 37, and an insulating protective cover 38. The plasma partition wall 32 is airtightly welded to the outer wall of the processing container 1. The plasma partition wall 32 is formed of, for example, quartz. The plasma partition wall 32 has a concave cross section when viewed from above, and covers an opening 31 formed in the side wall of the processing container 1. The opening 31 is formed elongated in the vertical direction to cover all the substrates W supported by the boat 5 in the vertical direction. The gas supply pipes 22 and 23 are provided in the inner space defined by the plasma partition wall 32 and communicating with the inside of the processing container 1, that is, the plasma generation space S. The gas supply pipe 21 is provided at a position close to the substrates W along the inner side wall of the processing container 1 outside the plasma generation space S.

Each of the pair of plasma electrodes 33 has an elongated shape, and as illustrated in FIG. 2, the pair of plasma electrodes 33 is disposed to face each other along the vertical direction on the outer surfaces of both concave and facing walls of the plasma partition wall 32. A feeding line 34 is connected to each plasma electrode 33.

The feeding line 34 electrically connects each plasma electrode 33 and the matching unit 35. The matching unit 35 is connected to the RF power supply 37 via the coaxial cable 36. RF power is supplied from the RF power supply 37 to each plasma electrode 33. As a result, for example, the $NH_3$ gas discharged from the gas supply pipe 22 is formed into a plasma in the plasma generation space S to which RF power is applied, and the thus generated active species for nitriding is supplied to the inside of the processing container 1 through the opening 31. Further, for example, the $H_2$ gas discharged from the gas supply pipe 22 is formed into a plasma in the plasma generation space S to which RF power is applied, and the thus generated hydrogen radicals are supplied to the inside of the processing container 1 through the opening 31. For example, the $Cl_2$ gas discharged from the gas supply pipe 23 is formed into a plasma in the plasma generation space S to which RF power is applied, and the thus generated chlorine radicals are supplied to the inside of the processing container 1 through the opening 31.

The insulating protective cover 38 is attached to the outside of the plasma partition wall 32 to cover the plasma partition wall 32. A coolant passage (not illustrated) is provided in the inner portion of the insulating protective cover 38, and the plasma electrodes 33 are cooled by causing a coolant such as cooled $N_2$ gas to flow through the coolant passage.

An exhaust port 40 for evacuating the inside of the processing container 1 is provided on the side wall of the processing container 1 facing the opening 31. The exhaust port 40 is formed vertically elongated corresponding to the boat 5. An exhaust port cover member 41 having a U-shaped cross section is attached to a portion corresponding to the exhaust port 40 of the processing container 1 to cover the exhaust port 40. The exhaust port cover member 41 extends upward along the side wall of the processing container 1. An exhaust pipe 42 for exhausting the processing container 1 is connected to the lower portion of the exhaust port cover member 41 via the exhaust port 40. The exhaust pipe 42 is connected with a pressure control valve 43 for controlling the pressure in the processing container 1 and an exhaust device 44 including a vacuum pump, and the inside of the processing container 1 is exhausted by the exhaust device 44 via the exhaust pipe 42. A cylindrical heating mechanism 50 is provided around the processing container 1. The heating mechanism 50 heats the processing container 1 and the substrates W provided therein.

The plasma processing apparatus 100 includes a controller 60. The controller 60 performs a film forming method by controlling, for example, the operation of each unit of the plasma processing apparatus 100.

[RF Power Supply/Matching Unit]

Figure 3:
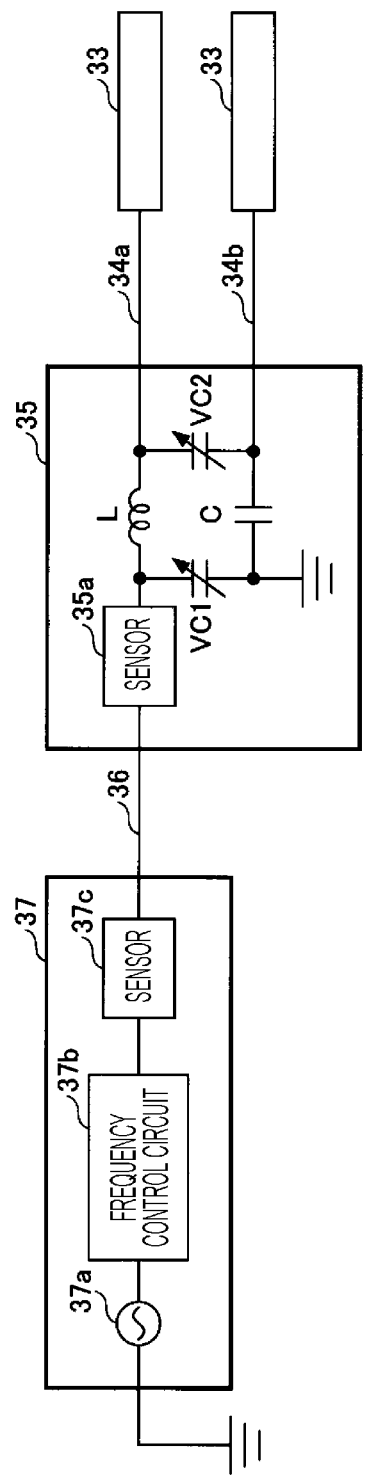
FIG. 3 is an internal configuration diagram of an RF power supply and a matching unit according to the embodiment.

The internal configuration of the RF power supply 37 and the matching unit 35 will be described with reference to FIG. 3. The RF power supply 37 may be implemented as a variable frequency RF power supply having a function of changing the RF frequency. The RF power supply 37 includes a power supply 37a, a frequency control circuit 37b, and a sensor 37c. The RF power supply 37 is an example of a radio-frequency power supply that applies a radio frequency of a variably controlled frequency.

The matching unit 35 includes an inductor L, a fixed capacitor C, and variable capacitors VC1 and VC2. The matching unit 35 further includes a sensor 35a. The inductor L is connected in series to one feeding line 34a of the feeding lines 34 and one of the plasma electrodes 33. The fixed capacitor C is connected in series with the other feeding line 34b and the other plasma electrode 33. The sensor 35a is connected in series with the feeding line 34a and the inductor L, and is connected to the RF power supply 37 via the coaxial cable 36. The variable capacitors VC1 and VC2 are connected in parallel to the plasma electrode 33 across the feeding lines 34a and 34b. While the inductor L and the fixed capacitor C are interposed between the variable capacitors VC1 and VC2, the variable capacitor VC1 is connected to the sensor 35a and the variable capacitor VC2 is connected to the plasma electrode 33 (i.e., the load side).

The variable capacitor VC1 controls the impedance on the load side, and the variable capacitor VC2 controls the phase. The variable capacitors VC1 and VC2 adjust the matching positions automatically and mechanically in order to adjust the impedance so that the RF power supplied from the RF power supply 37 to the plasma electrode 33 is maximized during use (during plasma generation). That is, by aligning the matching positions of the variable capacitors VC1 and VC2 so that the reflected wave detected by the sensor 37a is minimized, the impedance is adjusted so that the RF power is maximized during use (during plasma generation). The matching positions of the variable capacitors VC1 and VC2 may be confirmed by the sensor 35a.

The RF power supply 37 includes a power supply 37a, a frequency control circuit 37b, and a sensor 37c. The power supply 37a outputs an RF having a frequency variably controlled by the frequency control circuit 37b. The sensor 37c detects the reflected wave from the load side with respect to the RF power applied to the plasma electrode 33. In this way, the state of the reflected wave is monitored by the sensor 37c in the RF power supply 37.

In the control of the matching unit 35, the variable capacitors VC1 and VC2 are set to predetermined capacities (hereinafter, referred to as presets) when the RF is turned ON. When the RF power is applied at the preset matching positions, a plasma ignition may not occur when a voltage between the plasma electrodes 33 becomes lower. Therefore, in the related art, the matching positions are changed from the preset matching positions, and the voltage between the plasma electrodes 33 is controlled to be a voltage capable of plasma ignition. However, since the variable capacitors VC1 and VC2 are motor-controlled, it takes time for the matching positions of the variable capacitors VC1 and VC2 to move from the initial positions to the changed positions. Therefore, in the ALD process, there is a problem that a reflected wave is generated at the timing when the RF is turned ON (applied to the plasma electrode 33) by an RF power from the RF power supply 37.

In order to solve this problem, when the RF is turned ON to generate a plasma, the controller 60 of the present disclosure controls the variable capacitors VC1 and VC2, which move slowly to the matching positions for the motor control, by using the preset positions as the matching positions. Meanwhile, the RF power supply 37 capable of high-speed variable frequency for electronic control controls the RF frequency to be higher than 13.56 MHz so that the voltage between the plasma electrodes 33 becomes higher for about several milliseconds after the RF is turned ON. A plasma ignition may be facilitated by increasing the voltage between the electrodes according to Paschen's law. Immediately after the plasma ignition is performed in a short time of several milliseconds after the RF is turned ON, the frequency of the RF output from the RF power supply 37 is changed to 13.56 MHz.

When the variable capacitors VC1 and VC2 follow the frequency variable control of about several milliseconds, there is a concern that the reflected wave may become larger. However, since the variable capacitors VC1 and VC2 are motor-controlled, the variable capacitors VC1 and VC2 may not follow the frequency variable control of about several milliseconds. As a result, a stable plasma ignition and a suppression of reflected waves may be achieved at the same time by using the speed difference between the electronic control of the RF power supply 37 and the mechanical control of the matching unit 35. The time of several milliseconds after turning ON the RF is an example of a predetermined time after applying a frequency higher than 13.56 MHz. The predetermined time may be, for example, 1 millisecond or more and 100 milliseconds or less. Further, a frequency higher than 13.56 MHz is an example of a radio frequency of a first frequency, and a frequency of 13.56 MHz is an example of a radio frequency of a second frequency. Hereinafter, descriptions will be made on the configuration and specific control of the controller 60 that performs such a control.

[Controller]

Figure 4:
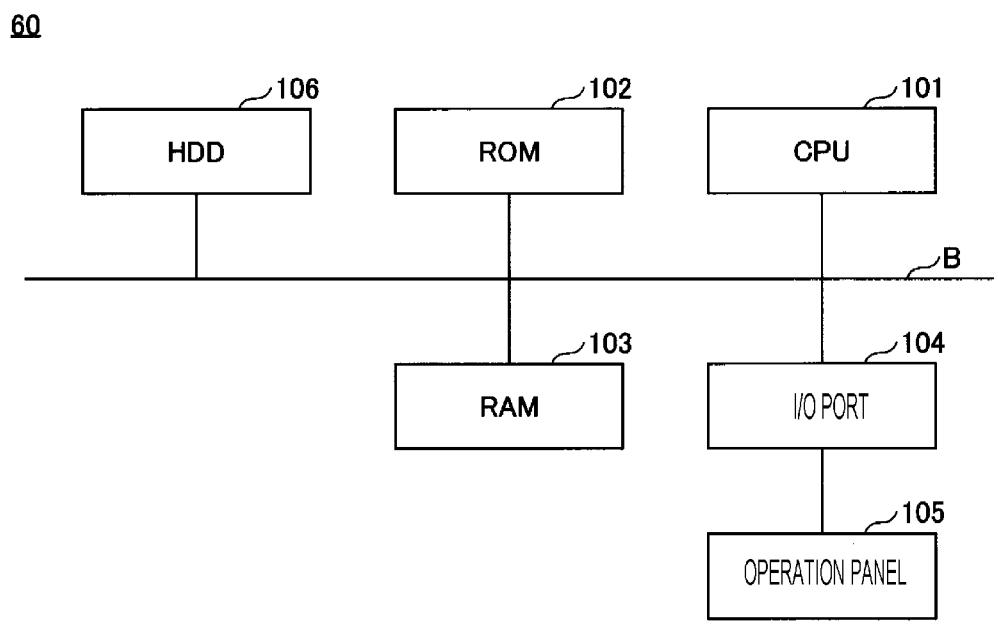
FIG. 4 is a hardware configuration diagram of a controller according to the embodiment.

As illustrated in FIG. 4, the controller 60 includes a central processing unit (CPU) 101, a read only memory (ROM) 102, a random access memory (RAM) 103, an I/O port 104, an operation panel 105, and a hard disk drive (HDD) 106. Each unit is connected by a bus B.

The CPU 101 performs a substrate process and a cleaning process such as a film forming process performed by the plasma processing apparatus 100 based on various programs read into RAM 103 and recipes which are information defining procedures for processes such as a film forming process and a cleaning process. The recipes include a recipe that defines the processing procedure of the film forming method including the ignition method of the present disclosure. The CPU 101 executes the film forming method including the ignition method based on a recipe or a program read into the RAM 103.

The ROM 102 is a storage medium that is constituted by an electrically erasable programmable read-only memory (EEPROM), a flash memory, or a hard disk, and stores a program or a recipe of the CPU 101. The RAM 103 functions as a work area of the CPU 101.

The I/O port 104 acquires the values of various sensors for detecting a temperature, a pressure, and a gas flow rate from various sensors attached to the plasma processing apparatus 100 and transmits the values to the CPU 101. Further, the I/O port 104 outputs a control signal output by the CPU 101 to each part of the plasma processing apparatus 100. The operation panel 105 for an operator to operate the plasma processing apparatus 100 is connected to the I/O port 104. The HDD 106 is an auxiliary storage device and may store recipes and programs. Also, a condition table 110 is stored in the HDD 106 or the RAM 103.

FIG. 5 is a diagram illustrating an example of a condition table 110 according to the embodiment. In the condition table 110 according to the embodiment, various types of information such as presets, threshold values, operation start conditions, and set powers for process conditions A to E are set and prepared before the process is executed. For example, as for the process conditions A to E, conditions related to the control of the matching unit 35 and the RF power supply 37 are set in advance in each step (e.g., the plasma generation step of NH$_3$ gas) when the ALD process is executed by the plasma processing apparatus 100.

The positions VC1$_p$ and VC2$_p$ (%) at which the variable capacitors VC1 and VC2 are preset, and the value of the reflected wave Pr (W) detected by the sensor 37c (hereinafter, referred to as an updated Pr value) are stored in the preset information. The threshold values ΔVC1 and ΔVC2 (%) are used to determine the update of the positions at which the variable capacitors VC1 and VC2 are preset. The positions at which the variable capacitors VC1 and VC2 are preset and the threshold values ΔVC1 and ΔVC2 are displayed in the unit of %, which indicate 0% to 100% of the variable capacitance range.

The frequency (MHz) and time (milliseconds) at the start of operation of the RF power supply 37 for each process condition are preset in the operation start condition. In the set power, the value of a traveling wave Pr (W), which indicates the RF power at the start of operation output from the RF power supply 37, is preset.

Figure 6:
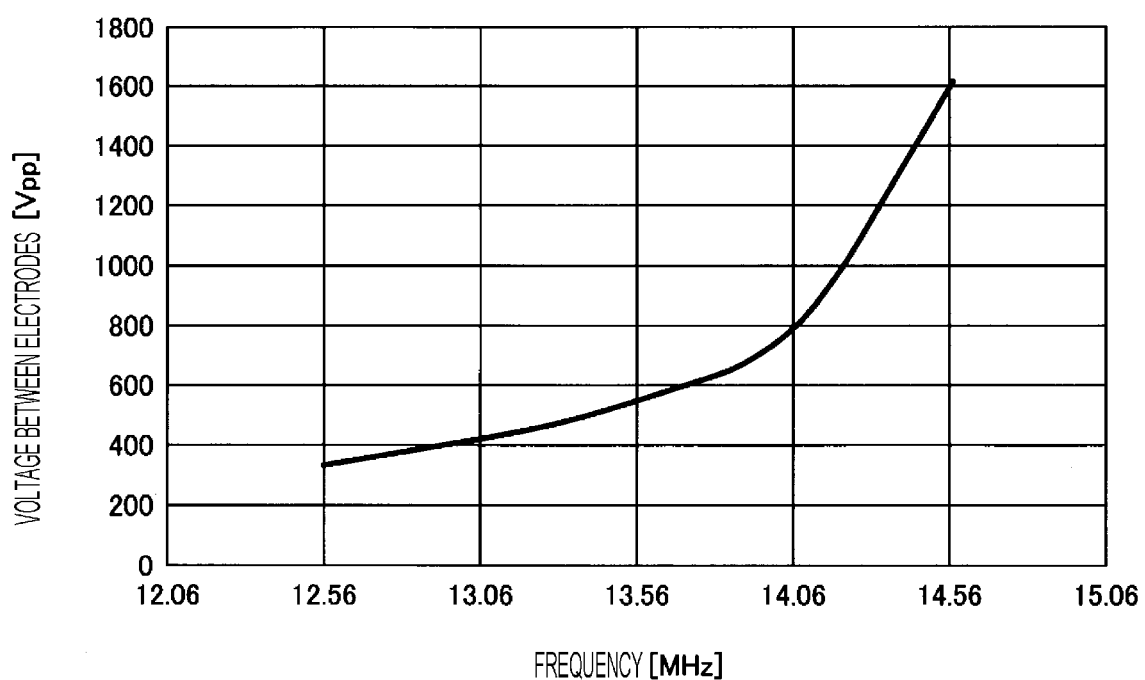
FIG. 6 is a graph illustrating a correlation between the frequency of a RF power supply and the voltage between electrodes.

FIG. 6 is a graph illustrating a correlation between the RF frequency indicated on the horizontal axis and the voltage between the plasma electrodes 33 indicated on the vertical axis. When the RF frequency is 13.56 MHz, the voltage between the plasma electrodes 33 is lower than 600 Vpp, and a plasma ignition does not occur depending on the type and pressure of the gas. When the RF frequency is higher than 13.56 MHz, for example, when the RF frequency is changed to 14.06 MHz to 14.56 MHz, the voltage between the plasma electrodes 33 may be increased to 800 Vpp to 1600 Vpp, and the plasma ignition may be surely implemented. Therefore, in the ignition method according to the present disclosure, the RF frequency output from the RF power supply 37 is instantaneously increased for about several milliseconds at the start of the process to ensure the plasma ignition.

[Film Forming Method]

Figure 7:
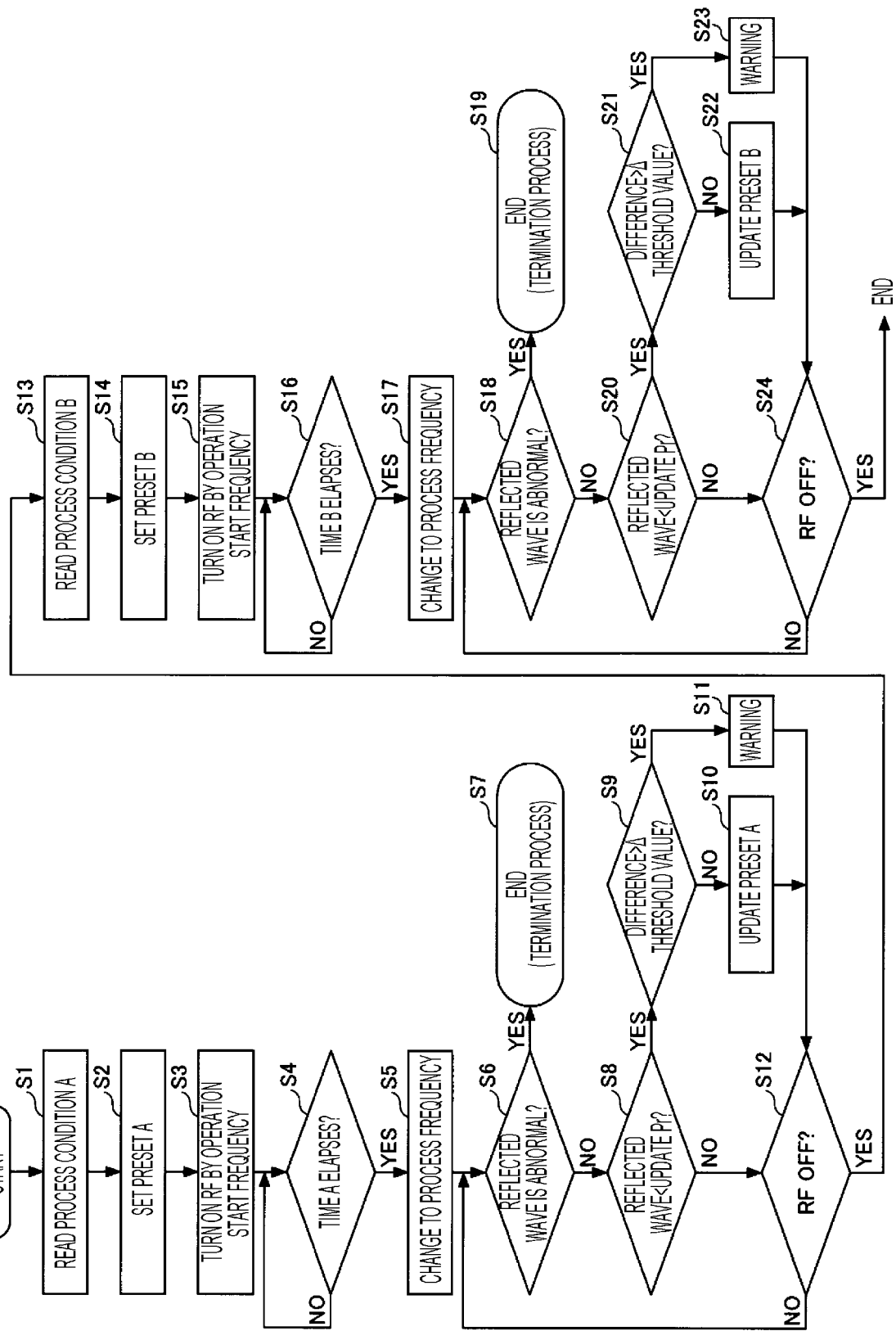
FIG. 7 is a flow chart illustrating a film forming method according to the embodiment.
Figure 8:
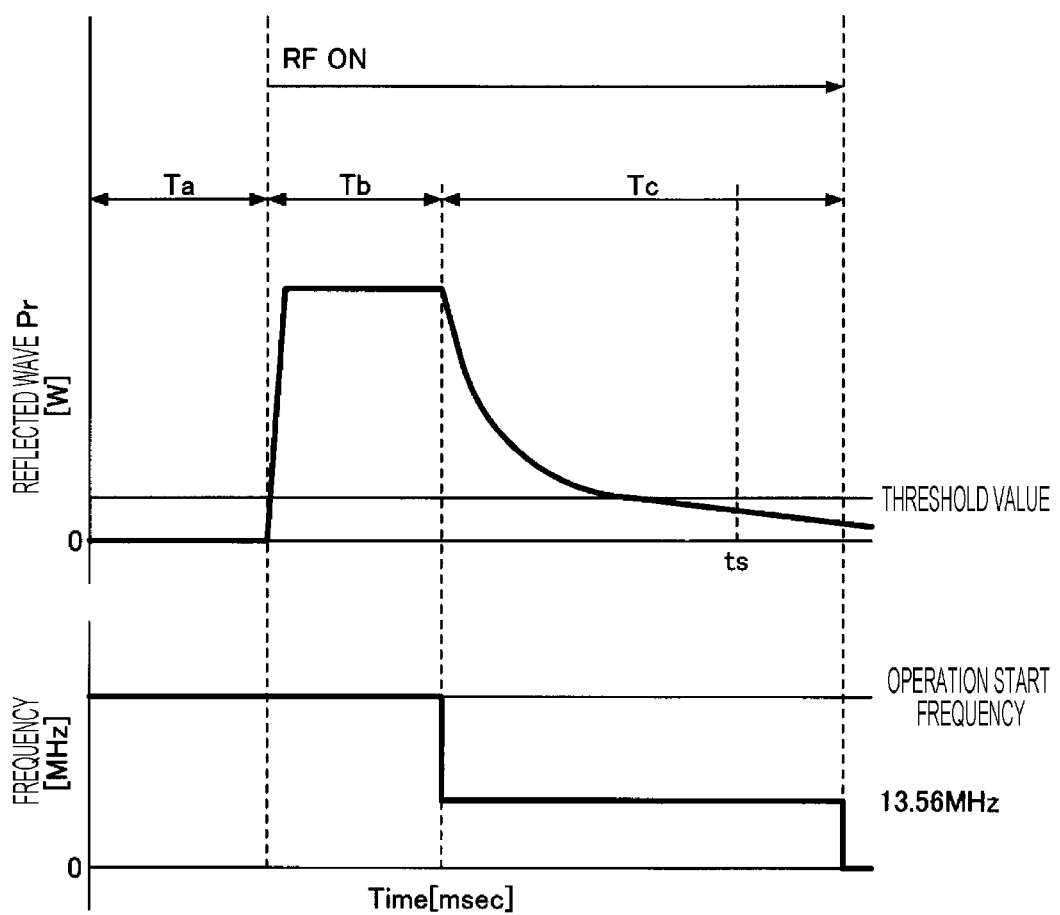
FIG. 8 is a diagram illustrating the film forming method according to the embodiment.

Next, a film forming method including an ignition method will be described with reference to FIGS. 7 and 8. FIG. 7 is a flow chart illustrating a film forming method according to the embodiment. FIG. 8 is a diagram illustrating a film forming method according to the embodiment.

FIG. 7 illustrates a film forming process in which each process (each step) of process condition A→process condition B→process condition C→ . . . is cyclically repeated by the ALD method, which is an example of the film forming method of the present disclosure. For example, when a SiN film is formed by using the ALD method, substrates W may be exposed to hydrogen plasma and chlorine plasma in order to increase the cycle rate after supplying NH$_3$ gas and before adsorbing TSA. In this case, under the process condition A using the film forming method of FIG. 7, NH$_3$ gas is supplied from the gas supply pipe 22 into the processing container 1 to generate a plasma of NH$_3$ gas. Under the process condition B, H$_2$ gas is supplied from the gas supply pipe 22 into the processing container 1 to generate a plasma of H$_2$ gas. Under the process condition C, Cl$_2$ gas is supplied from the gas supply pipe 23 into the processing container 1 to generate a plasma of Cl$_2$ gas. After that, the TSA is supplied into the processing container 1 from the gas supply pipe 21. Then, the atomic layer deposition process is cyclically repeated in the order of these processes.

As a premise of the film forming process of the present disclosure, the reflected wave Pr is always monitored by the sensor 37c in the RF power supply 37, and the matching positions of the variable capacitors VC1 and VC2 are automatically controlled by the sensor 35a in the matching unit 35 to reduce the reflection according to the state of the reflected wave Pr.

When the process is started, the controller 60 reads the process condition A with reference to the condition table 110 of FIG. 5 (step S1). The controller 60 sets positions C1a and C2a of the presets (preset A) in the process condition A, and controls the matching positions of the variable capacitors VC1 and VC2 to the positions C1a and C2a (step S2).

Next, the controller 60 controls the frequency of the RF power supply 37 to the frequency of the operation start condition (operation start frequency fa) defined in the process condition A with reference to the condition table 110, and turns ON (applies) the RF of the set power Pfa defined in the process condition A (step S3). Steps S2 and S3 may be performed at the same time. As a result, after the idle time Ta illustrated in FIG. 8 has elapsed, the frequency of the RF power supply 37 is controlled to the operation start frequency, and the RF is turned ON with the set power Pfa defined in the process condition A.

Next, the controller 60 sets time A of the operation start condition (time to in the condition table 110) defined in the process condition A with reference to the condition table 110, and determines whether the time A has elapsed since the RF was turned ON (step S4). When it is determined that the time A has elapsed since the RF was turned ON, the controller 60 changes the frequency of the RF power supply 37 to 13.56 MHz, which is a preset process frequency (step S5), and continues to output the RF with the set power Pfa. As a result, the frequency of the RF power supply 37 is controlled to the process frequency after an ignition time Tb (=time A) illustrated in FIG. 8 has elapsed.

In the process of the process condition A, plasma is generated from the gas A set in the process condition A. In the present disclosure, the gas A is supplied into the processing container 1, and the RF power having an operation start frequency is applied from the RF power supply 37 to the plasma electrode 33 for several milliseconds. The ignition time Tb is a short time of several milliseconds. The operation start frequency is higher than 13.56 MHz, for example, 14.06 MHz to 14.56 MHz. Thus, the A gas is surely formed into a plasma to generate an active species of the A gas and supply the active species to the substrates W.

As a result, by applying the RF power having an operation start frequency higher than 13.56 MHz during the ignition time Tb, the voltage between the plasma electrodes 33 may be increased to reliably perform the plasma ignition. In addition, it is possible to suppress the reflected wave Pr from being generated in a short time of 1 millisecond or more and 100 milliseconds or less, for example, several milliseconds to about 10 milliseconds after the RF is turned ON.

Next, the controller 60 determines whether the detected value of the reflected wave is abnormal after the lapse of a predetermined time (step S6). For example, when the detected value of the reflected wave detected by the sensor 37c after the ignition time Tb (time is in FIG. 8) is larger than the threshold value for abnormality determination, the controller 60 determines that the value of the reflected wave is abnormal. In this case, the controller 60 performs a process termination process (step S7) and terminates this process. An abnormal value for RF having a frequency of 13.56 MHz is preset in the threshold value for abnormality determination, and is stored in, for example, the condition table 110 of FIG. 5 or another table.

When the detected value of the reflected wave after the elapse of a predetermined time is equal to or less than the threshold value for abnormality determination, the controller 60 determines that the value of the reflected wave is normal, and determines whether the value of the reflected wave is smaller than the update Pr value (step S8). When it is determined that the value of the reflected wave is equal to or larger than the update Pr value, the controller 60 determines that the preset of the condition table 110 is not updated, and proceeds to step S12.

When it is determined that the value of the reflected wave is smaller than the update Pr value, the controller 60 calculates a difference between the preset positions $VC1_P$ and $VC2_P$ of the variable capacitors VC1 and VC2 stored in the condition table 110 and the current matching positions of the variable capacitors VC1 and VC2. The controller 60 compares the difference with the threshold values $\Delta VC1$ and $\Delta VC2$ (step S9). In the case of the process condition A in the condition table of FIG. 5, the controller 60 uses the threshold values $\Delta S1a$ and $\Delta S2a$ as the threshold values $\Delta VC1$ and $\Delta VC2$.

When a difference between the preset position $VC1_P$ of the variable capacitor VC1 and the current matching position is larger than the threshold value $\Delta S1a$, or a difference between the preset position of the variable capacitor $VC2_P$ and the current matching position is larger than the threshold value $\Delta S2a$, the controller 60 outputs a warning (step S11). Then, the process proceeds to step S12. The warning may be output by a display or a voice.

When the difference between the preset position $VC1_P$ of the variable capacitor VC1 and the current matching position is larger than the threshold value $\Delta S1a$, or the difference between the preset position of the variable capacitor $VC2_P$ and the current matching position is larger than the threshold value $\Delta S2a$, the controller 60 updates the preset A (step S10). Then, the process proceeds to step S12. At this time, among the preset values $VC1_p$ and $VC2_p$, and the update Pr value of the process condition A in the condition table of FIG. 5, C1a, C2a, and Fra corresponding to the preset A are updated. Thus, in the next process, the matching position having a smaller reflected wave may be set as the preset position of the variable capacitors VC1 and VC2, and the generation of the reflected wave may be further suppressed.

In step S12, the controller 60 determines whether the RF output from the RF power supply 37 has been turned OFF. The controller 60 repeats the processes of steps S6 to S12 until the RF has been turned OFF. When it is determined that the RF has been turned OFF, the controller 60 proceeds to the process of the next process condition B, reads the process condition B from the condition table 110 (step S13), and executes the processes of steps S14 to S24 according to the process condition B. The processes of steps S14 to S24 correspond to the processes of steps S2 to S12, and these processes are different from each other only in that the process condition is changed from the process condition A set in the condition table 110 to the process condition B. Therefore, the description of each process in steps S14 to S24 will be omitted.

In the film forming process by the ALD method, the process of process condition A→process condition B→process condition C→ . . . is cyclically repeated. For example, when forming a SiN film, plasma of $NH_3$ gas may be generated under the process condition A, hydrogen plasma may be generated under the process condition B, and chlorine plasma may be generated under the process condition C. In this case, the ignition of each plasma may be reliably performed. After the process of the process condition C, the raw material gas (e.g., TSA) is supplied.

According to the film forming method described above, when the RF is turned ON to generate a plasma, the variable capacitors VC1 and VC2, which move slowly to the matching position as compared with electronic control for mechanical control, control a preset position as the matching position. Further, the RF power supply 37 capable of high-speed variable frequency for electronic control controls the RF frequency to be higher than 13.56 MHz so that the voltage between the plasma electrodes 33 becomes higher for about several milliseconds after the RF is turned ON. Thus, a stable plasma ignition may be implemented by increasing the voltage between the electrodes according to Paschen's law. A few milliseconds after the RF is turned ON, the frequency of the RF output from the RF power supply 37 is changed to 13.56 MHz.

In the control of the present disclosure, the RF frequency is instantaneously controlled to a frequency larger than 13.56 MHz for only several milliseconds from the time when the RF is turned ON, and is changed to 13.56 MHz after several milliseconds. When the variable capacitors VC1 and VC2 follow the frequency variable control of about several milliseconds, there is a concern that the reflected wave may become larger. However, since the variable capacitors VC1 and VC2 are motor-controlled, they may not follow the frequency variable control of about several milliseconds. Therefore, the matching operation of the variable capacitors VC1 and VC2 is not affected, and there is no concern that the reflected wave may become larger. From the above, a stable plasma ignition and a suppression of reflected waves may be implemented by using a difference in control speed between the electronic control of the RF power supply 37 and the mechanical control of the matching unit 35.

Further, the preset positions of the variable capacitors VC1 and VC2 are changed when a film is deposited on the processing container 1 by the film forming process or when the deposited film is removed by the cleaning process. This change may be fed back to the preset position when the next RF is turned ON by updating the presets ($VC1_p$, $VC2_p$, and update Pr) of the condition table 110. As a result, a more stable plasma ignition and a suppression of reflected waves may be implemented.

In the above, descriptions have been made on the ALD process executed under a plurality of plasma gas and pressure conditions in a batch type plasma processing apparatus 100 capable of simultaneously forming plural films as in the configuration illustrated in FIG. 1. However, the present disclosure is not limited thereto, and may also be used for an ALD process executed by a single-wafer type plasma processing apparatus or a semi-batch type plasma processing apparatus capable of simultaneously forming several films. Further, the present disclosure may be used not only for the ALD process but also for the plasma process such as the ALE process or the CVD process executed by such plasma processing apparatuses. The plasma process includes an etching process, a film forming process, and a cleaning process in which various gases are formed into a plasma and used. In the ignition method of the present disclosure, a stable plasma ignition may be implemented in these plasma processes, and the generation of reflected wave of RF may be suppressed.

When a single-wafer plasma processing apparatus is used, the RF from the RF power supply may be applied to an upper electrode, a lower electrode, or both the upper electrode and the lower electrode, and the RF of two frequencies may be applied to the lower electrode. In either case, a stable plasma ignition may be implemented by the ignition method of the present disclosure. The plasma processing apparatus is applicable to any type of apparatuses such as an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

As described above, in the ignition method and the plasma processing apparatus that executes the ignition method according to the present disclosure, it is possible to suppress the generation of reflected waves of radio frequency while implementing a stable plasma ignition control.

According to an aspect of the present disclosure, a stable plasma ignition may be implemented.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An ignition method in a plasma processing apparatus comprising:
    establishing a preset process radio frequency (RF) and a predetermined ignition time associated with a process to be performed by the plasma processing apparatus;
    applying a first radio frequency from a radio-frequency power supply to an electrode of a plasma generator, by controlling the radio frequency power supply, to ignite plasma from a gas, the radio-frequency power supply applying a variably controlled radio frequency to the electrode of the plasma generator; and
    applying a second radio frequency, which is the preset process radio frequency, and is different from the first radio frequency, to the electrode of the plasma generator by controlling the radio-frequency power supply, after the predetermined ignition time has elapsed after applying the first radio frequency to the electrode of the plasma generator.

2. The ignition method according to claim 1, wherein the second radio frequency is lower than the first radio frequency.

3. The ignition method according to claim 1, wherein the predetermined ignition time is 1 millisecond or more and 100 milliseconds or less.

4. The ignition method according to claim 1, wherein, when a plurality of processes with different process conditions is sequentially performed with reference to a preset condition table, the igniting of the plasma variably controls the first radio frequency to an operation start frequency of each process set in the condition table for each process.

5. The ignition method according to claim 4, wherein, when a detected value of a reflected wave in a process with a specific process condition is compared with an updated value of the reflected wave of the specific process condition stored in the condition table, and the detected value of the reflected wave is smaller than the updated value of the reflected wave, a preset position of a variable capacitor stored in the condition table in association with the updated value of the reflected wave and the updated value of the reflected wave are updated by a matching position of the variable capacitor and the detected value of the reflected wave in the process, and
    wherein the variable capacitor is provided in a matching box provided between the radio-frequency power supply and the electrode of the plasma generator.

6. The ignition method according to claim 5, wherein, when a difference between the preset position of the variable capacitor stored in the condition table and the matching position of the variable capacitor of the matching box in the process is larger than a preset threshold value, the preset position of the variable capacitor stored in the condition table and the updated value of the reflected wave are not updated.

7. The ignition method according to claim 6, wherein, when the difference is larger than the threshold value, a warning is output.

8. A plasma processing apparatus comprising:
    a radio-frequency power supply configured to apply a radio frequency of a variably controlled frequency;
    a plasma generator including an electrode to which the radio frequency is applied and configured to generate a plasma from a gas;
    a matching box provided between the radio-frequency power supply and the electrode; and
    a controller configured to control the radio-frequency power supply and the matching box to execute a process including:
        establishing a preset process radio frequency (RF) and a predetermined ignition time associated with a process to be performed by the plasma processing apparatus;
        applying a first radio frequency from the radio-frequency power supply to the electrode of the plasma generator, by controlling the radio frequency power supply, to ignite plasma from a gas, and including variably controlling the radio frequency to the electrode of the plasma generator; and
        applying a second radio frequency, which is the preset process radio frequency, and is different from the first radio frequency, to the electrode of the plasma generator by controlling the radio frequency power supply, after the predetermined ignition time has elapsed after applying the first radio frequency to the electrode of the plasma generator.

* * * * *